US009869780B2

(12) United States Patent
Lee et al.

(10) Patent No.: US 9,869,780 B2
(45) Date of Patent: Jan. 16, 2018

(54) ORGANIC-INORGANIC COMPOSITE FILMS AND METHODS OF MANUFACTURING THE SAME

(71) Applicant: Samsung Electronics Co., Ltd., Suwon-si, Gyeonggi-do (KR)

(72) Inventors: Duhyun Lee, Yongin-si (KR); Byungkyu Lee, Seoul (KR); Sunil Kim, Osan-si (KR); Jaechul Park, Yangju-si (KR); Dongwook Lee, Suwon-si (KR); Changbum Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/738,530

(22) Filed: Jun. 12, 2015

(65) Prior Publication Data
US 2016/0103233 A1 Apr. 14, 2016

(30) Foreign Application Priority Data

Oct. 10, 2014 (KR) .................. 10-2014-0136961

(51) Int. Cl.
*G01T 1/24* (2006.01)
*H01B 1/02* (2006.01)
*H01L 27/146* (2006.01)

(52) U.S. Cl.
CPC ............... *G01T 1/244* (2013.01); *G01T 1/24* (2013.01); *H01B 1/02* (2013.01); *H01L 27/14676* (2013.01)

(58) Field of Classification Search
CPC ...................................................... G01T 1/244
See application file for complete search history.

(56) References Cited

U.S. PATENT DOCUMENTS

| 5,892,227 A * | 4/1999 | Schieber .................. G01T 1/24 250/370.12 |
| 2005/0118527 A1* | 6/2005 | Harel et al. ............... 430/270.1 |
| 2012/0181440 A1* | 7/2012 | Kim et al. ............... 250/370.01 |

FOREIGN PATENT DOCUMENTS

| JP | H1086366 A | 4/1998 |
| JP | 2003242879 A | 8/2003 |
| KR | 100846211 B1 | 7/2008 |

* cited by examiner

*Primary Examiner* — David Porta
*Assistant Examiner* — Hugh H Maupin

(57) ABSTRACT

A method of manufacturing an organic-inorganic composite thin film may include: forming a thin film from a paste that includes an inorganic powder and an organic compound binder by using a screen printing process; and/or performing a pressing process and a heating process with respect to the thin film. The heating process may be performed at a glass transition temperature of the organic compound binder or in a temperature range higher than the glass transition temperature of the organic compound binder. An X-ray detector configured to detect X-rays irradiated from an outside of the X-ray detector may include: a photoconductive material layer in which electron-hole pairs are formed due to absorption of the X-rays. The photoconductive material layer may be formed of an organic-inorganic composite thin film that includes an inorganic powder and an organic compound binder.

20 Claims, 4 Drawing Sheets

ORGANIC-INORGANIC COMPOSITE FILMS AND METHODS OF MANUFACTURING THE SAME

CROSS-REFERENCE TO RELATED APPLICATION(S)

This application claims priority from Korean Patent Application No. 10-2014-0136961, filed on Oct. 10, 2014, in the Korean Intellectual Property Office (KIPO), the entire contents of which are incorporated herein by reference.

BACKGROUND

1. Field

Some example embodiments of the present disclosure may relate generally to organic-inorganic composite films. Some example embodiments of the present disclosure may relate generally to methods of manufacturing organic-inorganic composite films.

2. Description of Related Art

A screen printing process may be used to manufacture electric and electronic devices. When a thin film is manufactured by using such a process, mixing of materials that constitute a thin film and uniform distribution of an inorganic material after forming the thin film may positively affect the characteristics of a device including the thin film.

For example, a surface of the thin film may be rough and voids may occur in the thin film. The structural defects of the thin film may reduce the performance and reliability of the device that includes the thin film. The roughness of the surface of the thin film may be reduced by controlling process variables of the screen printing process, but the roughness may not be completely eliminated. Also, when an electrode having a small thickness is formed on a surface of the thin film that includes a defect, disconnected areas may be formed in the electrode.

SUMMARY

Some example embodiments may provide organic-inorganic composite thin films that have reduced internal defects.

Some example embodiments may provide organic-inorganic composite thin films that are formed by using screen printing processes.

Some example embodiments may provide methods of manufacturing organic-inorganic composite thin films by using screen printing processes.

In some example embodiments, a method of manufacturing an organic-inorganic composite thin film may comprise: forming a thin film from a paste that comprises an inorganic powder and an organic compound binder by using a screen printing process; and/or performing a pressing process and a heating process with respect to the thin film. The heating process may be performed at a glass transition temperature of the organic compound binder or in a temperature range higher than the glass transition temperature of the organic compound binder.

In some example embodiments, the pressing process may be performed under pressure greater than or equal to about 50 kgf/cm$^2$ and less than or equal to about 2,000 kgf/cm$^2$.

In some example embodiments, the heating process may be performed at the glass transition temperature of the organic compound binder, or in a temperature range from the glass transition temperature of the organic compound binder to a temperature higher by 10° C. than the glass transition temperature of the organic compound binder.

In some example embodiments, the pressing process or the heating process may be performed for greater than or equal to about 5 minutes and less than or equal to about 30 minutes.

In some example embodiments, the organic compound binder may be a thermoplastic resin. The heating process may be performed at a temperature greater than or equal to about 65° C. and less than or equal to about 77° C.

In some example embodiments, the organic compound binder may be polyvinyl butyral (PVB).

In some example embodiments, the inorganic powder may comprise mercury(II) iodide (HgI$_2$).

In some example embodiments, the pressing process may be performed by using plates positioned on both sides of the thin film or by using a roller that comes in contact with at least one surface of the thin film.

In some example embodiments, the heating process may be performed by using a heating element formed in the plates.

In some example embodiments, an organic-inorganic composite thin film may be formed by: forming a thin film from a paste that comprises an inorganic powder and an organic compound binder by using a screen printing process; and/or performing a pressing process and a heating process with respect to the thin film. The heating process may be performed at a glass transition temperature of the organic compound binder or in a temperature range higher than the glass transition temperature of the organic compound binder. The organic-inorganic composite thin film may comprise the inorganic powder and the organic compound binder.

In some example embodiments, an X-ray detector configured to detect X-rays irradiated from an outside of the X-ray detector may comprise: a photoconductive material layer in which electron-hole pairs are formed due to absorption of the X-rays. The photoconductive material layer may be formed of an organic-inorganic composite thin film that comprises an inorganic powder and an organic compound binder.

In some example embodiments, the organic compound binder may be polyvinyl butyral (PVB).

In some example embodiments, the inorganic powder may comprise mercury(II) iodide (HgI$_2$).

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
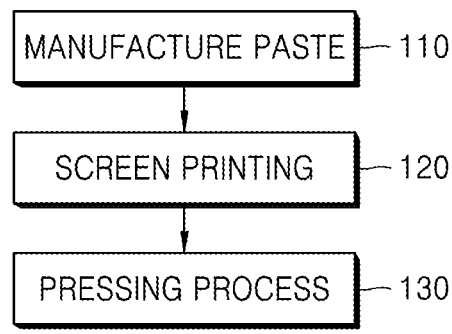
FIG. 1 is a flow chart of a method of manufacturing an organic-inorganic composite thin film according to some example embodiments of the inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2A:
FIGS. 2A though 2D are cross-sectional view illustrating a method of manufacturing an organic-inorganic composite thin film according to some example embodiments of the inventive concepts.

FIG. 1 is a flow chart of a method of manufacturing an organic-inorganic composite thin film according to some example embodiments of the inventive concepts. FIGS. 2A though 2D are cross-sectional views illustrating a method of manufacturing an organic-inorganic composite thin film according to some example embodiments of the inventive concepts.

Referring to FIG. 1 and FIG. 2A, first a paste is formed through a paste manufacturing process (110). The paste may include, for example, an inorganic powder and an organic compound binder. The paste may be formed, for example, of various materials according to the kind of thin film to be formed. For example, in order to form a thin film to be used for a sensing material film of an X-ray detector, an inorganic powder may be mercury(II) iodide ($HgI_2$) powder, and an organic compound binder may be a thermoplastic polymer, for example, polyvinyl butyral (PVB). A paste may be formed, for example, by mixing an inorganic powder and an organic compound binder in a solvent 210 in a container 200. The solvent 210 may be, for example, Butyl CELLOSOLVE™, toluene, or di(propylene glycol) methyl ether (DPGME). The paste may be formed in a sol state or gel state having viscosity.

Figure 2B:
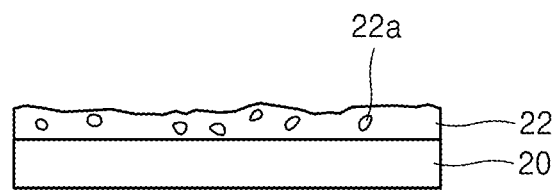

Referring to FIG. 1 and FIG. 2B, the formed paste 22 is coated on a substrate 20, that is, a lower structure to be formed by using a screen printing process (120). The substrate 20 is not specifically limited as long as the substrate 20 is formed of a material that may be used for coating the paste 22 in the screen printing process (120). For example, the substrate 20 may be a silicon substrate or a glass substrate. Next, the solvent 210 included in the paste 22 is removed. A drying process with respect to the paste 22 may be performed to remove the solvent 210. The drying process may be performed at a high temperature for a few minutes to a few tens of minutes. For example, in the case of paste that includes $HgI_2$ as an inorganic powder and PVB as an organic compound binder, and butyl CELLOSOLVE™ as the solvent, the solvent included in the paste may be removed by performing a drying process at a temperature of approximately 60° C. for a few tens of minutes. The paste 22 from which the solvent 210 is removed may be an organic-inorganic composite thin film. At this point, a plurality of voids 22a may be formed in the organic-inorganic composite thin film and, thus, due to the existence of the voids 22a, filling density of the thin film may be reduced.

The organic-inorganic composite thin film according to some example embodiments of the inventive concepts may be used in various devices. For example, when the organic-inorganic composite thin film is used as sensing material of an X-ray detector, electrodes formed of conductive material may be respectively formed on and under the organic-inorganic composite thin film, and current may flow through the organic-inorganic composite thin film. If the organic-inorganic composite thin film is not uniformly formed, for example, voids 22a are formed in the organic-inorganic composite thin film, or the organic compound binder is largely distributed on a surface of the organic-inorganic composite thin film, a stable current path may be formed in the organic-inorganic composite thin film. Therefore, the device characteristic of the X-ray detector may be reduced and the distribution of the device characteristic from one location to another may occur.

Figure 2C:
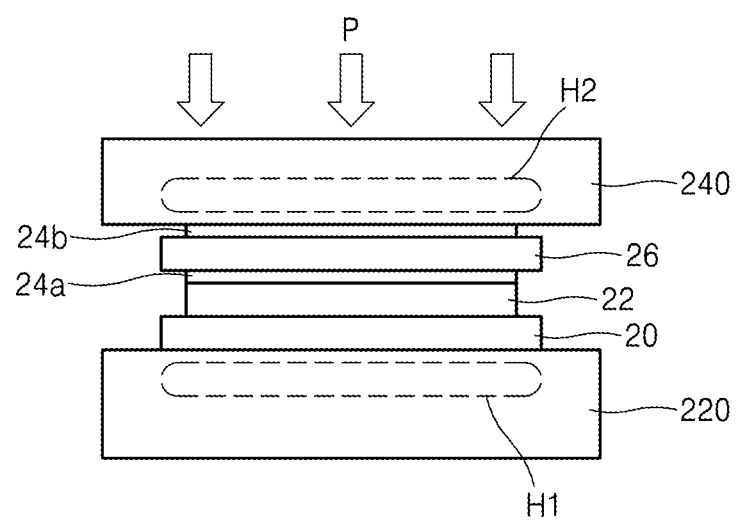

Referring to FIG. 1 and FIG. 2C, after performing a drying process with respect to the paste 22 described above, a pressing process (130) may be additionally performed. Also, together with the pressing process (130), or separately from the pressing process (130), a heating process may be performed. In order to perform the pressing process (130), the substrate 20 on which the paste 22 is formed may be inserted between a first plate 220 and a second plate 240. While performing the pressing process (130), in order to prevent the paste 22 from causing cracks on a surface thereof in the pressing process (130) and to ensure a uniform pressing process (130), first and second buffer layers 24a and 24b may further be formed on the paste 22. The first and second buffer layers 24a and 24b may be formed of material having a certain degree of elasticity. For example, the first and second buffer layers 24a and 24b may be formed of rubber, polymer, or silicon. Also, a third buffer layer 26 may further be used in the pressing process (130). At this point, the first buffer layer 24a, the third buffer layer 26, and the second buffer layer 24b may be sequentially formed in the stated order on the paste 22. The first plate 220 and the second plate 240 may apply pressure with respect to the paste 22, and first and second heaters H1 and H2, respectively, may be formed in the first plate 220 and the second plate 240. While applying pressure with respect to the paste 22 coated on the substrate 20 by using the first plate 220 and the second plate 240, a heating process may be simultaneously performed with respect to the paste 22 by using the first and second heaters H1 and H2.

As depicted in FIG. 2C, the pressing process (130) may be such that pressure P is applied with respect to the paste 22 coated on the substrate 20 from upper and lower sides of the paste 22 by respectively using the first plate 220 and the second plate 240, or another method may be used.

The method of FIG. 1 may be used in more general purpose manufacturing processes. For example, the method may be used in manufacturing other types of films, such as other types of composite films or thin films. In another example, the method may be used in manufacturing other products using screen printing.

Figure 3:
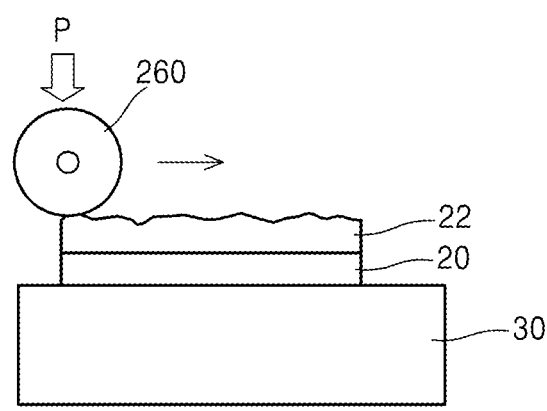
FIG. 3 is a cross-sectional view illustrating another example of a pressing process of an organic-inorganic composite thin film according to some example embodiments of the inventive concepts.

FIG. 3 is a cross-sectional view illustrating another example of a pressing process of an organic-inorganic composite thin film according to some example embodiments of the inventive concepts. In FIG. 3, a plate 30 is located on a lower side of the substrate 20 and the paste 22, and pressure P is applied by using a roller 260 on one side of the paste 22. Also, pressure P may be applied to the paste 22 by using two rollers from both sides of the paste 22. If the substrate 20 has a hard characteristic that may be breakable like a glass substrate, a method shown in FIG. 2C or FIG. 3 may be used. If the substrate 20 is formed of a flexible material, as depicted in FIG. 3, while pressing on the paste 22 by using the roller 260, pressure may be applied to the paste 22 by using an additional roller on a lower side of the substrate 20.

Pressure P applied to press the thin film paste 22 may be varied according to the inorganic powder and the organic compound binder that are included in the paste 22. For example, the thickness or shape of the thin film paste 22 may be changed by applying a pressure in a range from about 50 kgf/cm$^2$ to about 2,000 kgf/cm$^2$ with respect to the thin film paste 22.

When a heating process is performed simultaneously with or separately from the pressing process (130) with respect to the paste 22 formed by screen printing, the physical properties of the paste 22 formed by screen printing may further be increased. When a heating process is performed, the polymer-type organic compound binder included in the paste 22 may be softened, and the efficiency of the pressing process (130) may further be increased. The heating process may be performed near a glass transition temperature of the organic compound binder included in the paste 22. For example, the heating process may be performed at a glass transition temperature of the organic compound binder or in a temperature range from the glass transition temperature of the organic compound binder to a temperature higher than the glass transition temperature of the organic compound binder by 10° C. If the organic compound binder is PVB, PVB may have a glass transition temperature range from about 65° C. to about 67° C., and the heating process may be performed at a temperature range from about 65° C. to about 77° C. The pressing process (130) and the heating process may be performed for 5 minutes to 30 minutes.

Figure 2D:
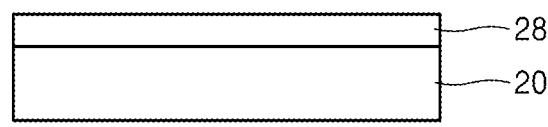

As described above, the organic-inorganic composite thin film 28 according to some example embodiments of the inventive concepts may be manufactured as shown in FIGS. 1 and 2D through the paste manufacturing process (110), the screen printing process (120), and the pressing process (130). Also, a heating process may further be performed with respect to the thin film paste 22 and, thus, the inorganic powder and the organic compound binder in the thin film paste 22 may be further uniformly distributed. Due to the pressing process (130), flatness of a surface of the thin film paste 22, the internal filling density, or flatness of the surface of the thin film paste 22 and the internal filling density may be increased. Similarly, due to the heating process, flatness of the surface of the thin film paste 22, the internal filling density, or flatness of the surface of the thin film paste 22 and the internal filling density may be increased.

The paste 22 in which $HgI_2$ is used as an inorganic powder and PVB is used as an organic compound binder is coated on a glass substrate 20 by using a screen printing process (120). Afterwards, a pressing process (130) at a pressure of 60 kgf/cm$^2$ and a heating process at a temperature of 70° C. are performed for approximately 10 minutes. It is confirmed that the flatness of the surface of the organic-inorganic composite thin film manufactured through the pressing process (130) and the heating process are increased. Also, a root mean square (RMS) roughness value is also improved from 4.7 microns (µm), which is a value immediately after screen printing, to 0.21 µm, and a peak-to-valley value is improved from 53.2 µm to 9 µm. Also, it is observed that voids on the surface and inner side of the thin film paste 22 are also reduced and the inorganic material is uniformly distributed on the surface of the thin film paste 22.

Figure 4:
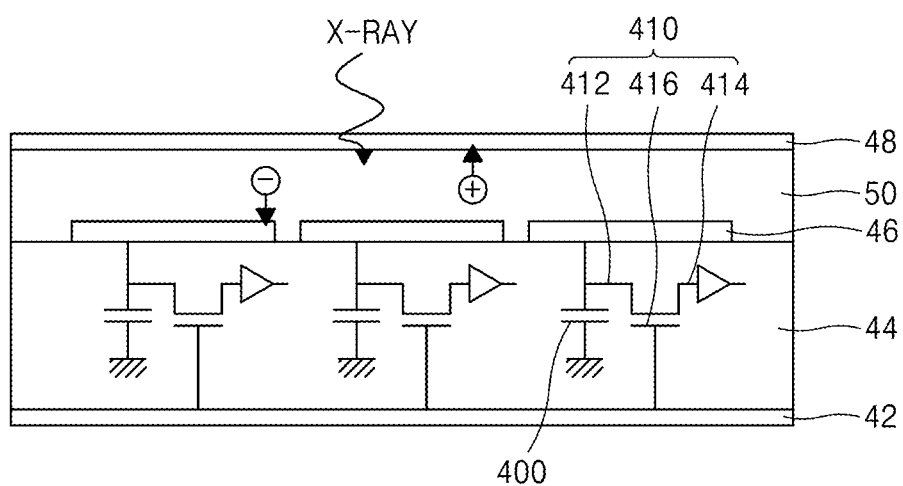
FIG. 4 is a cross-sectional view of an X-ray detector having an organic-inorganic composite thin film according to some example embodiments of the inventive concepts.

FIG. 4 is a cross-sectional view of an X-ray detector having an organic-inorganic composite thin film according to some example embodiments of the inventive concepts.

Referring to FIG. 4, the X-ray detector is a device that may detect X-rays irradiated from the outside. A photoconductive material layer 50 may generate electron-hole pairs by absorbing X-rays that are irradiated to an upper electrode 48 from the outside. When a voltage is applied to the upper electrode 48, an electromagnetic field may be formed in the photoconductive material layer 50, and the electron-hole pairs may be separated from each other by the electromagnetic field. For example, when a negative voltage is applied to the upper electrode 48, negative charges (e.g., electrons) may move toward a current collecting electrode 46. In another example, when a positive voltage is applied to the upper electrode 48, positive charges may move toward the current collecting electrode 46. Charges moved to the current collecting electrode 46 may be stored in a storage capacitor 400.

When a gate voltage is applied to a gate electrode 416 of a thin film transistor structure 410 that is formed in an insulating layer 44 of the X-ray detector through a lower electrode 42, the thin film transistor is turned ON and, then, the charges stored in the storage capacitor 400 may move from a source 412 to a drain 414 of the thin film transistor structure 410 and, thus, may move to an external data processing unit.

The organic-inorganic composite thin film according to some example embodiments of the inventive concepts may be used in a photoconductive material layer 50. The surface flatness and the internal filling density of the organic-inorganic composite thin film may be increased through the pressing process (130), the heating process, or both that are performed during manufacturing the organic-inorganic composite thin film as described with reference to FIG. 1.

According to some example embodiments of the inventive concepts, an organic-inorganic composite thin film having improved surface flatness and internal filling density may be provided through performing a pressing process and a heating process with respect to a thin film paste that is formed by using a screen printing process, wherein the paste is formed of an inorganic powder and an organic compound binder. An organic-inorganic composite thin film having a uniform surface flatness and improved fine structure may be manufactured by performing a heating process, together with a pressing process or in addition to the pressing process, with respect to a thin film paste formed by a screen printing process.

Although some example embodiments of the present disclosure have been shown and described, it would be appreciated by those skilled in the art that changes may be made in these example embodiments without departing from the principles and spirit of the invention, the scope of which is defined in the claims and their equivalents.

It should be understood that the example embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing an organic-inorganic composite thin film, the method comprising:
    forming a thin film from a paste that comprises an inorganic powder and an organic compound binder by using a screen printing process; and
    performing a pressing process and a heating process with respect to the thin film;
    wherein the heating process is performed at a glass transition temperature of the organic compound binder or in a temperature range higher than the glass transition temperature of the organic compound binder, and
    wherein the pressing process and the heating process are performed simultaneously.

2. The method of claim 1, wherein the pressing process is performed under pressure greater than or equal to about 50 kgf/cm$^2$ and less than or equal to about 2,000 kgf/cm$^2$.

3. The method of claim 1, wherein the heating process is performed at the glass transition temperature of the organic compound binder, or in a temperature range from the glass transition temperature of the organic compound binder to a temperature higher by 10° C. than the glass transition temperature of the organic compound binder.

4. The method of claim 1, wherein the pressing process or the heating process is performed for greater than or equal to about 5 minutes and less than or equal to about 30 minutes.

5. The method of claim 1, wherein the organic compound binder is a thermoplastic resin, and
    wherein the heating process is performed at a temperature greater than or equal to about 65° C. and less than or equal to about 77° C.

6. The method of claim 1, wherein the organic compound binder is polyvinyl butyral (PVB).

7. The method of claim 1, wherein the inorganic powder comprises mercury(II) iodide ($HgI_2$).

8. The method of claim 1, wherein the pressing process is performed by using plates positioned on both sides of the thin film or by using a roller that comes into contact with at least one surface of the thin film.

9. The method of claim 8, wherein the heating process is performed by using a heating element formed in the plates.

10. An organic-inorganic composite thin film formed by the method of claim 1 and comprises the inorganic powder and the organic compound binder.

11. An X-ray detector configured to detect X-rays irradiated from an outside of the X-ray detector, the X-ray detector comprising:
    a photoconductive material layer in which electron-hole pairs are formed due to absorption of the X-rays;
    wherein the photoconductive material layer is formed of an organic-inorganic composite thin film that comprises an inorganic powder and an organic compound binder, the organic-inorganic composite thin film formed using a pressing process and a heating process with respect to the organic-inorganic composite thin film, and
    wherein the pressing process and the heating process are performed simultaneously.

12. The X-ray detector of claim 11, wherein the organic compound binder is polyvinyl butyral (PVB).

13. The X-ray detector of claim 11, wherein the inorganic powder comprises mercury(II) iodide ($HgI_2$).

14. The X-ray detector of claim 11, wherein the heating process is performed at a glass transition temperature of the organic compound binder or in a temperature range higher than the glass transition temperature of the organic compound binder.

15. The X-ray detector of claim 11, wherein the pressing process is performed under pressure greater than or equal to about 50 kgf/cm$^2$ and less than or equal to about 2,000 kgf/cm$^2$.

16. The X-ray detector of claim 11, wherein the heating process is performed at a glass transition temperature of the organic compound binder, or in a temperature range from the glass transition temperature of the organic compound binder to a temperature higher by 10° C. than the glass transition temperature of the organic compound binder.

17. The X-ray detector of claim 11, wherein the pressing process or the heating process is performed for greater than or equal to about 5 minutes and less than or equal to about 30 minutes.

18. The X-ray detector of claim 11, wherein the organic compound binder is a thermoplastic resin, and
    wherein the heating process is performed at a temperature greater than or equal to about 65° C. and less than or equal to about 77° C.

19. The X-ray detector of claim 11, wherein the pressing process is performed by using plates positioned on both sides of the thin film or by using a roller that comes into contact with at least one surface of the thin film.

20. The X-ray detector of claim 19, wherein the heating process is performed by using a heating element formed in the plates.

* * * * *